United States Patent [19]

Yamamoto et al.

[11] Patent Number: 4,792,960
[45] Date of Patent: Dec. 20, 1988

[54] SEMICONDUCTOR LASER

[75] Inventors: Saburo Yamamoto, Nara; Hiroshi Hayashi, Kyoto; Taiji Morimoto; Seiki Yano, both of Nara, all of Japan

[73] Assignee: Sharp Kabushiki Kaisha, Osaka, Japan

[21] Appl. No.: 726,356

[22] Filed: Apr. 23, 1985

[30] Foreign Application Priority Data

Apr. 24, 1984 [JP] Japan ................... 59-83250
Apr. 24, 1984 [JP] Japan ................... 59-83251

[51] Int. Cl.⁴ ........................................... H01S 3/19
[52] U.S. Cl. .................................. 372/46; 372/45; 372/48
[58] Field of Search ............... 372/48, 46, 45, 44, 372/43

[56] References Cited

U.S. PATENT DOCUMENTS 4,545,057 10/1985 Hayakawa et al. ............. 372/48
4,589,115 5/1987 Barnham et al. ............... 372/45

FOREIGN PATENT DOCUMENTS 0145203 6/1985 European Pat. Off.
0125690 9/1980 Japan ............................. 372/48

OTHER PUBLICATIONS

S. Yamamoto et al, "680 nm CW Operation at Room Temperature by AlGaAs Double Heterojunction Lasers", IEEE Journal of Quantum Electronics, vol. QE-19, No. 6, Jun. 1983, pp. 1009-1015.
Patent Abstracts of Japan, vol. 7, No. 226 (E-202), Oct. 7, 1983, No. 58-115877 of T. Hayakawa.
S. Yamamoto et al, "Room-Temperature CW Operation in the Visible Spectral Range of 680-700 nm by AlGaAs Double Heterojunction Lasers", Applied Physics Letters, vol. 41, No. 9, Nov. 1982, pp. 796-798.
Patent Abstracts of Japan, vol. 6, No. 111 (E-114), Jun. 22nd, 1982, No. 57-42184 of M. Yano.

Primary Examiner—William L. Sikes
Assistant Examiner—Georgia Y. Epps
Attorney, Agent, or Firm—Spencer & Frank

[57] ABSTRACT

A semiconductor laser comprising a substrate for crystal growth having a striped channel, an active layer for laser oscillation, a cladding layer containing Mg which is in contact with said active layer at the side of said striped channel substrate.

7 Claims, 2 Drawing Sheets

SEMICONDUCTOR LASER

BACKGROUND OF THE INVENTION

1. Field of the Invention

This invention relates to a semiconductor laser having a doubleheterostructure on a striped channel substrate.

2. Description of the Prior Art (Semiconductor lasers for laser oscillation at a long wavelength of visible light)

In the preparation of the inner stripe geometric structure of a semiconductor laser for laser oscillation at a long wavelength of 750 nm or more or of other semiconductor devices, a crystalline layer is grown on a V- or U-shaped channel substrate by an epitaxial growth technique, wherein the channel in the substrate must not be deformed during the epitaxial growth of the layer. When molecular beam epitaxy (MBE) or metal organic-vapor phase epitaxy (MO-VPE) is used as the epitaxial growth technique, the original shape of the channel is maintained. However, since the crystalline layer is formed in accordance with the shape of the channel in the substrate, the surface of the resulting growth layer cannot be a plane.

On the other hand, if a substrate 1 which is etched, in advance, to form the V-shaped channel as is shown in FIG. 1 is provided, and a crystalline layer 3 is grown on this substrate using liquid phase epitaxy (LPE) as the epitaxial growth technique to completely fill the channel 2, the formation shown in FIG. 2 is created, resulting in a growth layer having a plane surface. However, each of the shoulder portions at both sides of the channel 2 undergoes meltback resulting in a rounded shape, so that the width W (shown in FIG. 1) of the channel 2 expands to W' (shown in FIG. 2). This is because the growth rate of the crystalline layer growing initially in the bottom of the channel 2 is so high that there is an insufficient amount of solute in the shoulder portions of the channel 2, so that meltback of the shoulder portions of the channel 2 occurs. The expansion of the width of the channel 2 from W to W' is undesirable. Moreover, impurities from the substrate 1 are mixed into the growth layer 3 resulting in inferior characteristics of the device.

(Semiconductor lasers for laser oscillation at a short wave length of visible light)

In the preparation of the inner stripe geometric structure of a semicondcutor laser for laser oscillation at a short wavelength, the first cladding layer is used to fill the channel in the substrate, resulting in the following drawbacks:

FIG. 3 shows a VSIS (V-shaped channel substrate inner stripe) semiconductor laser with a plane active layer, which was disclosed in TGED 81-42, 31 (1981-July) IECE Japan, comprising a p-GaAs substrate 11, an n-GaAs current blocking layer 12, a p-$Ga_{1-y}Al_yAs$ cladding layer 13, a p-$Ga_{1-x}Al_xAs$ active layer 14, an n-$Ga_{1-y}Al_yAs$ cladding layer 15 and an n-GaAs cap layer 16. The V-shaped channel 17 serves as an electroconductive region. In order that this VSIS laser having an inner stripe geometric structure attains laser oscillation at a wavelength of 750 nm or less, the mole ratio y of AlAs to GaAs in the cladding layers 13 and 15 must be 0.6 or more. When the mole ratio is less than 0.6, carriers leak out of the active layer 14 to the cladding layers 13 and 15 resulting in an increase in the threshold current and a decrease in the dependency of the threshold current upon temperature. Especially, extensive leakage of carriers (i.e., electrons) from the active layer 14 to the p-cladding layer 13 tends to take place, so that a considerably high barrier must be set to prevent such leakage of electrons to the p-cladding layer 13. The height of the barrier depends not only upon the mole-ratio y of the AlAs to GaAs by also the positive hole concentration of the p-cladding layer 13. For example, when the positive hole concentration is $5 \times 10^{17}$ cm$^{-3}$, the barrier must be raised to aproximately 50 meV (i.e., a 20 percent raise of the original barrier). This means that the positive hole concentration of the p-cladding layer 13 must be at least $1 \times 10^{18}$ cm$^{-3}$.

In order to obtain the carrier (positive hole) concentration at $1 \times 10^{18}$ cm$^{-3}$ or more in the p-$Ga_{1-y}Al_yAs$ cladding layer 13 wherein y is greater than 0.6, Mg is preferably used as a p-impurity since the addition of Mg in a concentration of 0.3 atomic percent or more to the p-cladding layer attains a carrier (positive hole) concentration of $1 \times 10^{18}$ cm$^{-3}$ or more. However, when Mg is added to the $Ga_{1-y}Al_yAs$ to a great extent, the growth rate of the crystalline layer decreases because Mg functions to reduce the diffusion coefficient of As in the Ga solution. Especially, when Mg in a concentration of 0.3 atomic percent is added to $Ga_{1-y}Al_yAs$ under the condition of y>0.6, the growth rate of the $Ga_{1-y}Al_yAs$ slow significantly, so that, as shown in FIG. 4, the channel 17 will be insufficiently filled with the p-cladding layer 13, resulting in an active layer 14 having a concave surface which induces the high-order transverse mode. Even though the growth period of the p-cladding layer 13 is extended during the growth process, the formation of an active layer 14 having a plane surface is quite difficult. Even if the plane surface of the active layer 14 results from the extension of the growth period, the portion of the p-cladding layer 13 on the outside of the channel 17 becomes too thick to serve as a waveguide. As mentioned above, the addition of Mg in the selected concentration to the p-cladding $Ga_{1-y}Al_yAs$ (y>0.6) layer in a conventional manner to obtain a positive hole concentration of at least $1 \times 10^{18}$ cm$^{-3}$ in the p-cladding layer, cannot attain a good yield of semiconductor lasers having excellent characteristics and good reproducibility of the characteristics of the lasers.

SUMMARY OF THE INVENTION

The semiconductor laser of this invention which overcomes the above-discussed disadvatages and numerous other drawbacks and deficiencies of the prior art, comprises a substrate for crystal growth having a striped channel, an active layer for laser oscillation, a cladding layer containing Mg which is in contact with said active layer at the side of said striped channel substrate.

The cladding layer is formed on the striped channel substrate by liquid phase epitaxy using a crystal growth solution containing Mg in a concentration of 0.3 atomic percent or more.

A filler layer is disposed between the striped channel substrate and the cladding layer to fill the channel in said substrate, the Mg content of said filler layer being less than that of said cladding layer.

Thus, the invention described herein makes possible the objects of (1) providing a novel and useful semiconductor laser for laser oscillation at a long wavelength of visible light, wherein the channel in the substrate is not deformed (i.e. the channel does not undergo meltback)

during the epitaxial growth of the crystalline layer to fill the channel; and (2) providing a novel and useful semiconductor laser for laser oscillation at a short wavelength of visible light which has a cladding layer containing a sufficient carrier concentration thereby attaining an excellent yield and an excellent reproducibility of characteristics.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 5:
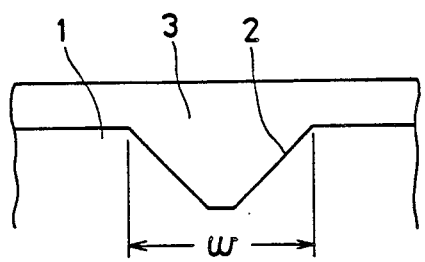
FIG. 5 is a front sectional view showing an epitaxial growth layer on the substrate according to this invention.

The semiconductor laser for laser oscillation at a long wavelength of visible light of this invention is constructed based on the experimental results that deformation of the channel in the substrate is minimal and the original width W thereof as shown in FIG. 5 is maintained when a crystalline layer is formed on the substrate by an epitaxial growth technique using a crystal growth solution containing Mg of 0.3 atomic percent concentration or more. Mg attains the reduction of the diffusion coefficient of the solute in the crystal growth solution, thereby decreasing the initial growth rate of the crystalline layer in the bottom of the channel. Thus, the vicinity of the shoulder of the channel is not short of solute, and accordingly the substrate does not undergo meltback, so that the width W of the channel is maintained and contamination by impurities from the substrate 1 to the growth layer 3 can be prevented, resulting in a device having excellent characteristics. Since Mg is a p-impurity, Mg alone is added to the crystal growth solution when the growth layer 3 is of a p-type (positive conducting type), while Mg is added together with n-impurities such as Te, etc., when the growth layer 3 is used as an n-type (negative conducting type).

The semiconductor laser for laser oscillation at a short wavelength of visible light of this invention is produced as followed:

First, the channel in the substrate for the crystal growth is filled with a crystalline layer containing Mg in a low concentration (e.g., 0.2 atomic percent or less) until the surface of the crystalline layer forms a plane. Then, on the crystalline layer, a cladding layer, which has a mole ratio of 0.6 or more of AlAs to GaAs and contains Mg in a higher concentration (e.g., 0.3 atomic percent or more) than the concentration of Mg in the growth layer, is grown with a selected carrier concentration and a selected thickness. On the cladding layer, a plane active layer is grown resulting in a semiconductor laser for laser oscillation at a short wavelength having a multiple-layered crystal structure. Since the channel is filled, first, with a crystalline layer containing Mg in a low concentration, the growth rate of the crystal layer does not slow down so that the diffusion coefficient of As in the crystal growth solution can be maintained at a certain level and the channel is quickly filled therewith, resulting in a growth layer, the surface of which forms a plane in a considerably short period of time. Since the amount of Mg in the growth solution is small, the channel tends to undergo a slight meltback thereby deforming slightly, but such a slight deformation of the channel has less effect upon laser oscillation at a short wavelength. As a cladding layer containing a large amount of Mg and having a sufficient carrier concentration is grown on the growth layer followed by growing a plane active layer on the cladding layer, leakage of carriers from the active layer to the cladding layer can be prevented, resulting in a doubleheterostructure which can attain laser oscillation at a short wavelength. The resulting semiconductor laser has a low threshold current level and an excellent reproducibility of the temperature characteristic for laser oscillation. Moreover, this process can result in easy mass production on a commercial basis.

EXAMPLE 1

A semiconductor device having high quality crystal layers such as a semiconductor laser for laser oscillation at a long wavelength of visible light is produced, for example, using a liquid phase epitaxial growth technique of a sliding type, wherein a graphite boat including a crystal growth solution therein is moved on a substrate holder to coat a substrate fixed to the holder with the crystal growth solution to form a growth layer. According to this technique, multiple-layered crystal can be grown on a substrate for crystal growth.

Figure 6:
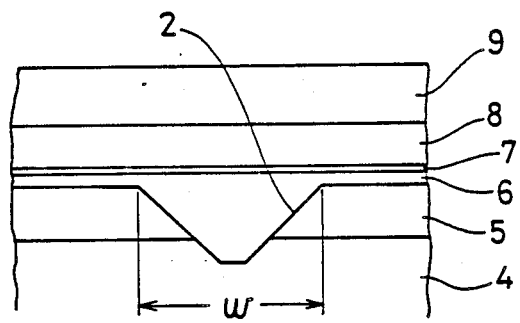
FIG. 6 is a front sectional view of a semiconductor laser for laser oscillation at a long wavelength of visible light according to this invention.

FIG. 6 shows a semiconductor laser for laser oscillation at a long wavelength of this invention using the above-mentioned technique, which was produced as follows:

On the (100) face of a Zn-doped p-GaAs substrate ($p = 1 \times 10^{19}$ cm$^{-3}$)4, a Te-doped n-GaAs current blocking layer ($n = 3 \times 10^{18}$ cm$^{-3}$)5 was grown with a thickness of 0.6 μm, followed by etching to form a striped channel 2 having a width W in the (110) direction as an electroconductive region. This channel 2 penetrates the substrate 4. On the substrate 4 having the channel 2, a Mg-doped p-Ga$_{0.5}$Al$_{0.5}$As cladding layer ($p = 1 \times 10^{18}$ to $2 \times 10^{18}$ cm$^{-3}$)6, a p-Ga$_{0.85}$Al$_{0.15}$As active layer 7, an n-Ga$_{0.5}$Al$_{0.5}$As cladding layer 8 and an n-GaAs cap layer 9 were successively grown to form a multiple-layered crystal for laser oscillation, resulting in a doubleheterostructure. An n-electrode and a p-electrode were connected to the cap layer 9 and the substrate 4, respectively.

Figure 1:
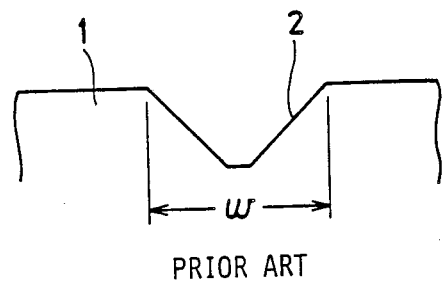
FIG. 1 is a front sectional view of a substrate having a V-shaped channel with a width W.
Figure 2:
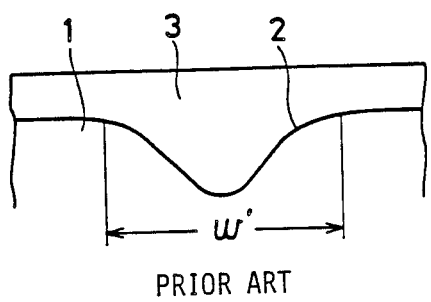
FIG. 2 is a front sectional view showing an epitaxial growth layer, which was formed using a conventional liquid phase epitaxy method, on the substrate in FIG. 1.
Figure 3:
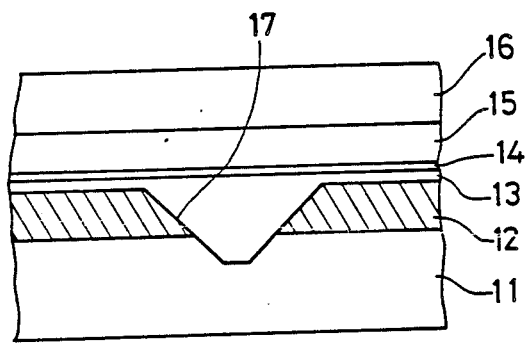
FIG. 3 is a front sectional view showing the fundamental structure of a VSIS laser.
Figure 4:
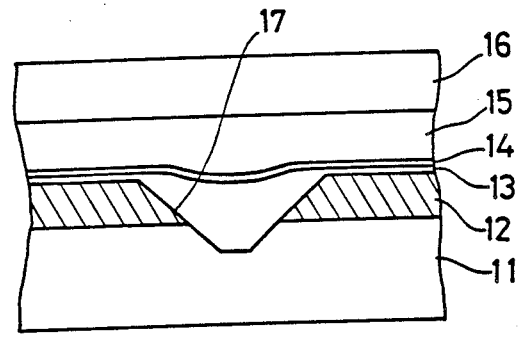
FIG. 4 is a front sectional view of a VSIS laser wherein the active layer has a concave surface.

As a reference standard, a p-cladding layer containing Mg in a concentration of 0.1 atomic percent was formed in the same manner as the above-mentioned. The width of the channel in the resulting semiconductor laser was greater than the original as shown in FIG. 2. The reference standard laser oscillated at a wavelength of 780 nm and exhibited a far-field pattern which is at an angle ranging from 9.5° to 10.5° from the active layer.

The width of the channel in the semiconductor laser of this invention obtained by the above-mentioned process was maintained at the original width W as shown in FIG. 6. Each of the semiconductor laser units according to this invention exhibited uniform characteristics, especially uniform threshold current and a uniform lateral far-field pattern which is parallel to the junction, although a conventional semiconductor laser exhibited a non-uniform threshold current and a non-uniform lateral far-field pattern parallel to the junction. Moreover, in the semiconductor laser of this invention, contamination by impurities from the n-GaAs current blocking layer 5 to the p-cladding layer 6 is prevented resulting in improved reliability of the laser.

As mentioned above, the p-cladding layer 6, which is formed on the current blocking layer 5 and the striped channel 2 by an epitaxial growth technique, fills the channel 2 during the growth thereof to thereby form a plane surface thereof. Therefore, the active layer 7 growing on the plane surface of the cladding layer 6 becomes flat and thin. Moreover, since the p-cladding layer 6 is grown using a Mg-doped GaAlAs solution (containing Mg of 0.3 atomic percent concentration or more) under the control of the initial growth rate by Mg in the bottom of the channel 2, the solute concentration in the GaAlAs solution is always maintained at a certain level during the epitaxial growth thereby preventing meltback in the shoulder portions of the channel 2 and contamination by components from the substrate 4 to the p-cladding layer 6. The Mg component which was doped to the p-cladding layer 6 is used as a p-impurity and the doping amount of Mg is selected to be 0.3 atomic percent concentration or more depending upon the desired carrier concentration.

The crystal growth method in Example 1 is not limited to the GaAs-GaAlAs system, but is can be applied to liquid phase epitaxy for other semiconductor devices of an InP-InGaAsP system etc.

EXAMPLE 2

Figure 7:
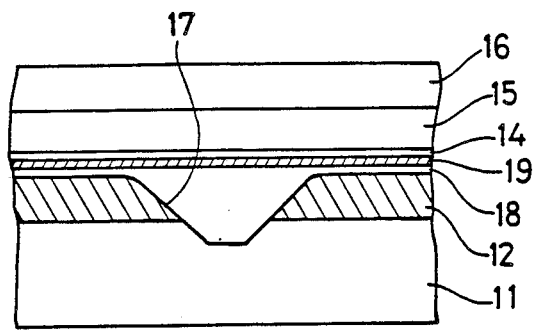
FIG. 7 is a front sectional view of a semiconductor laser for laser oscillation at a short wavelength of visible light according to this invention.

FIG. 7 shows a VSIS semiconductor laser for laser oscillation at a short wavelength of 700 mm or less of visible light, which was produced using a liquid phase epitaxy technique of a sliding type as follows:

On the (100) face of a Zn-doped p-GaAs substrate ($p=1\times10^{19}$ cm$^{-3}$)11, a Te-doped n-GaAs current blocking layer ($n=3\times10^{18}$ cm$^{-3}$)12 was grown with a thickness of 0.6 μm by liquid phase epitaxy, followed by etching to form a V-shaped stripe channel 17 having a width of 4 μm in the (110) direction. Due to the formation of the V-shaped channel 17, the corresponding portion of the current blocking layer 12 was removed from the substrate 11, resulting in an electric current path therein which is striped in structure. On the substrate 11 having the channel 17, a p-$Ga_{1-z}Al_zAs$ filler layer (z=0.7; Mg contents of 0.06 atomic percent)18, a p-$Ga_{1-y}Al_yAs$ cladding layer (y=0.8; Mg contents of 1.0 atomic percent)19, a p-$Ga_{1-x}Al_xAs$ active layer (x=0.3; Mg contents of 0.03 atomic percent)14, an n-$Ga_{1-y}Al_yAs$ cladding layer (y=0.8, Te contents of 0.001 atomic percent)15, and an n-GaAs cap layer (Te contents of 0.003 atomic percent) 16 were successively grown by liquid phase epitaxy to form a multiple-layered crystal for laser oscillaion having a doubleheterostructure. The mole ratio of AlAs to GaAs in each of the crystal layers meets the following requirements: $0<x<z\leq y$, and $0.6\leq z\leq y<1$. Since the Mg contents in the filler layer 18 was small, the growth rate of the filler layer 18 was so high that the channel 17 could be completely filled with the filler layer 18 in approximately 60 seconds. The surface of the resulting filler layer 18 was plane. Both shoulder portions of the channel 17 underwent a slight meltback. Each of the portions of the filler layer 18 on both sides of the channel 17 had a thickness of 0.1 μm. The p-cladding layer 19 was formed with a thickness of 0.1 μm, the p-active layer with a thickness of 0.08 μm, the n-cladding layer with a thickness of 1 μm, and the n-cap layer 16 with a thickness of 1 μm. Due to a large doping amount of Mg, the carrier concentration in the p-cladding layer 19 exhibited $3\times10^{18}$ cm$^{-3}$ and the barrier to electrons from the active layer 14 was as high as 230 meV, thereby attaining a sufficient confinement of electrons in the active layer 14 at the heterojunction. Then, a p-electrode and an n-electrode were formed on the substrate 11 and the cap layer 16, respectively, resulting in the desired VSIS semiconductor laser. When an electric current is injected into the semiconductor laser, the current flows through the striped channel 17 serving as a electroconductive region and laser operation starts in the corresponding portion of the active layer 14. The channel 17 acts as an inner striped structure focusing an electric current thereon.

The VSIS semiconductor laser in this example attained laser oscillation at a wavelength in the range from 680 to 700 nm at a threshold current of as small as 70 mA on the average. The dependency of the laser of the threshold current upon the temperature was as small as 0.6 mA/°C. Most of the semiconductor laser units in a wafer attained laser oscillation at a threshold current of 100 mA or less and were superior in the reproducibility of laser oscillation. It is known that some of the conventional semiconductor lasers attain continuous wave oscillation at a wavelength of 683 nm which is the shortest oscillation wavelength of known semiconductor lasers (Appl. Phys-Lett. vol. 41, p. 796, 1982).

In the VSIS semiconductor laser in Example 2, although the composition ratio of the mixed crystal is 0.6 or more which is extremely great, the positive hole concentration is as high as around $1\times10^{18}$ cm$^{-3}$ so that the threshold current level is reduced and reproducibility of the device characteristics can be improved.

The VSIS semiconductor laser of this invention is not limited to the GaAs-GaAlAs system, but it can be applied to a material such as an InP-InGaAsP system, a GaAsSb-AlGaAsSb system, etc.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims as construed as encompassing all the features of patentable novelty which reside in the present invention, including all features which would be treated as equivalents thereof by those skilled in the art to which this invention pertains.

What is claimed is:

1. In a semiconductor laser for laser oscillation at a short wavelength of visible light and of the type including a substrate having a striped channel in one surface thereof, an active layer for laser oscillation disposed on said one surface of said substrate above said striped channel, and a cladding layer containing Mg which is in contact with said active layer and disposed between said active layer and said one surface of said substrate; the improvement wherein a filler layer containing Mg is disposed between said one surface of said substrate having said striped channel and one surface of said cladding layer, contacts said one surface of said cladding layer, and fills said channel in said substrate, with the Mg content of said filler layer being less than that of said cladding layer.

2. A semiconductor laser as defined in claim 1 wherein said active layer and said cladding layer are substantially planar.

3. A semiconductor laser as defined in claim 1 wherein said semiconductor laser further includes a further cladding layer disposed on the opposite surface of said active layer, a cap layer formed on said further cladding layer, and first and second electrodes for said substrate and for said cap layer, respectively.

4. A semiconductor laser as defined in claim 3 further comprising a current blocking layer disposed on said one surface of said substrate beneath said filler layer and through which said channel extends.

5. A semiconductor laser as defined in claim 4 wherein: said substrate and said current blocking layer are formed of GaAs; said filler layer, said cladding layer, said active layer, said further cladding layer and said cap layer are all formed of GaAlAs; and the mole ratio of AlAs to GaAs in each of said cladding layers is between 0.6 and 1.

6. A semiconductor laser as defined in claim 5 wherein said Mg content of said filler layer is approximately 0.06 atomic percent and the Mg content of said cladding layer is approximately 1.0 atomic percent.

7. A semiconductor laser as defined in claim 6 wherein said substrate, said filler layer and said cladding layer are each of p-type conductivity, and said blocking layer, said further cladding layer and said cap layer are each of n-type conductivity.

* * * * *